(12) United States Patent
Friedrich et al.

(10) Patent No.: US 11,555,832 B2
(45) Date of Patent: Jan. 17, 2023

(54) INTEGRATED SHUNT AND MAGNETIC FIELD CURRENT SENSOR

(71) Applicant: Allegro MicroSystems, LLC, Manchester, NH (US)

(72) Inventors: Andreas P. Friedrich, Metz-Tessy (FR); Loïc André Messier, Vanzy (FR); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/189,480

(22) Filed: Mar. 2, 2021

(65) Prior Publication Data
US 2022/0283200 A1 Sep. 8, 2022

(51) Int. Cl.
G01R 15/20 (2006.01)
G01R 19/00 (2006.01)
G01K 7/22 (2006.01)

(52) U.S. Cl.
CPC ............ *G01R 15/202* (2013.01); *G01K 7/22* (2013.01); *G01R 19/0092* (2013.01)

(58) Field of Classification Search
CPC ..... G01R 15/202; G01R 19/0092; G01K 7/22
See application file for complete search history.

(56) References Cited

U.S. PATENT DOCUMENTS

| 7,476,816 | B2 | 1/2009 | Doogue et al. | |
| 8,604,777 | B2* | 12/2013 | Doogue | G01R 35/005 361/93.6 |
| 10,247,758 | B2 | 4/2019 | Milano et al. | |
| 10,380,879 | B2 | 8/2019 | Haas et al. | |
| 10,481,181 | B2 | 11/2019 | Bussing et al. | |
| 10,718,794 | B2 | 7/2020 | El Bacha et al. | |
| 11,187,724 | B2* | 11/2021 | Tsukahara | H01C 1/14 |
| 2013/0015843 | A1* | 1/2013 | Doogue | G01R 15/148 324/202 |
| 2013/0293224 | A1* | 11/2013 | Kotera | G01R 19/10 324/252 |
| 2018/0252748 | A1* | 9/2018 | Wood | G01R 21/133 |
| 2019/0221549 | A1* | 7/2019 | Hayashi | H01L 24/48 |
| 2021/0072309 | A1* | 3/2021 | Guan | G01R 15/207 |
| 2021/0263079 | A1* | 8/2021 | Schwarzberger | G01R 15/207 |

OTHER PUBLICATIONS

U.S. Appl. No. 16/841,853, filed Apr. 7, 2020, Augendre, et al.

* cited by examiner

*Primary Examiner* — Dominic E Hawkins
(74) *Attorney, Agent, or Firm* — Daly, Crowley, Mofford & Durkee, LLP (57) ABSTRACT

According to some embodiments, a device includes: a magnetic field current sensor magnetically coupled to a conductor and configured to generate a magnetic field signal having a magnitude responsive to a current flowing through the conductor; a shunt interface having first and second input terminals electrically coupled to ends of a shunt disposed along the conductor, the shunt interface configured to generate a shunt signal having a magnitude responsive to the current flowing through the conductor; and a diagnostic circuit configured to receive the magnetic field signal and the shunt signal and to generate a fault signal based on a comparison between the magnitude of the magnetic field signal and the magnitude of the shunt signal.

58 Claims, 5 Drawing Sheets

INTEGRATED SHUNT AND MAGNETIC FIELD CURRENT SENSOR

BACKGROUND

Various types of electrical current sensors are known in the art. Magnetic field current sensors include one or more magnetic field sensing elements positioned near a current-carrying conductor to sense a magnetic field generated by the current through the conductor. A magnetic field current sensor generates an output signal having a magnitude proportional to the magnetic field induced by the current through the conductor. Another approach to current sensing is the use of a shunt resistor (or "shunt") disposed along, or in series with, the conductor. A circuit, sometimes referred to as a "shunt interface" is configured to calculate the voltage drop across the shunt resistor and to determine the current which is proportional to the voltage drop.

Current sensors are used in many applications including automotive, industrial, and other safety-critical applications. The overall safety of systems and devices that utilize current sensors can depend on the accuracy and reliability of the current sensors.

SUMMARY

Disclosed herein are embodiments of current sensors that integrate both a shunt interface and a magnetic field current sensor. Various types of magnetic field current sensors can be used including coreless, differential Hall-effect current sensors. Disclosed embodiments provide heterogeneous, redundant current sensing with fault detection to provide improved safety and reliability. Embodiments of an integrated shunt and magnetic field current sensor can be provided within a single integrated circuit (IC) package to facilitate system integration. Redundant current sensing outputs and a fault pin can be connected to various external devices or systems, such as an Engine Control Unit (ECU). Disclosed embodiments may satisfy the requirements of safety-critical applications, such as Automotive Safety Integrity Level (ASIL) requirements for automotive applications.

According to one aspect of the disclosure, a device includes: a magnetic field current sensor magnetically coupled to a conductor and configured to generate a magnetic field signal having a magnitude responsive to a current flowing through the conductor; a shunt interface having first and second input terminals electrically coupled to ends of a shunt disposed along the conductor, the shunt interface configured to generate a shunt signal having a magnitude responsive to the current flowing through the conductor; and a diagnostic circuit configured to receive the magnetic field signal and the shunt signal and to generate a fault signal based on a comparison between the magnitude of the magnetic field signal and the magnitude of the shunt signal.

In some embodiments, the diagnostic circuit is configured to: calculate a difference between the magnitude of the magnetic field signal and the magnitude of the shunt signal; and compare the difference to a predetermined threshold value to generate the fault signal. In some embodiments, the device can further include: a first analog output driver configured to generate an analog magnetic field output signal responsive to the magnetic field signal; and a second analog output driver configured to generate an analog shunt output signal responsive to the shunt signal. In some embodiments, the diagnostic circuit is configured to generate the fault signal further based on a comparison of the analog magnetic field output signal and the analog shunt output signal. In some embodiments, the magnetic field current sensor is disposed on a die and the magnetic field current sensor is configured to receive a die temperature signal responsive to a temperature of the die and to adjust the magnitude of the magnetic field signal using the die temperature signal.

In some embodiments, the shunt interface is configured to receive a shunt temperature signal responsive to a temperature of the shunt and to adjust the magnitude of the shunt signal using the shunt temperature signal. In some embodiments, the shunt interface comprises: a differential amplifier having first and second input terminals coupled to the first and second input terminals of the shunt interface; and an output terminal to provide the shunt signal, wherein the shunt interface is configured to adjust a gain of the differential amplifier using the shunt temperature signal. In some embodiments, the signal responsive to the temperature of the shunt is received from an external temperature sensor configured to measure the temperature of the shunt. In some embodiments, the external temperature sensor comprises a negative temperature coefficient (NTC) thermistor. In some embodiments, the shunt interface is disposed on a die, wherein the shunt interface is configured to receive a die temperature signal responsive to a temperature of the die and to adjust the magnitude of the shunt signal further using the die temperature signal. In some embodiments, the magnetic field current sensor comprises a differential Hall-effect sensor.

In some embodiments, the device can further include: a first analog-to-digital converter (ADC) coupled to an output terminal of the magnetic field current sensor to convert the magnetic field signal from an analog signal to a digital signal; and a second ADC coupled to an output terminal of the shunt interface to convert the shunt signal from an analog signal to a digital signal, wherein the diagnostic circuit generates the fault signal based on a comparison between the digital magnetic field signal and the digital shunt signal. In some embodiments, the device can further include: a first digital output driver configured to generate a digital magnetic field output signal responsive to the digital magnetic field signal; and a digital second output driver configured to generate a digital shunt output signal responsive to the digital shunt signal, wherein the diagnostic circuit generates the fault signal based on a comparison between the digital magnetic field output signal and the digital shunt output signal.

In some embodiments, the device can include an isolation barrier between the first output driver and the second output driver. In some embodiments, the isolation barrier includes at least one of: a serial peripheral interface (SPI); an inter-integrated circuit (I2C) interface; or an optical interface. In some embodiments, the magnetic field current sensor, the shunt interface, and the diagnostic circuit are included within an integrated circuit (IC). In some embodiments, the magnetic field current sensor is included on a first die of the IC and the shunt interface is included on a second die of the IC. In some embodiments, the diagnostic circuit is included on the first die, and the device can further include: another diagnostic circuit, included on the second die, configured to receive the magnetic field signal and the shunt signal and to generate another fault signal based on another comparison between the magnitude of the magnetic field signal and the magnitude of the shunt signal.

According to another aspect of the disclosure, a method includes: generating, by a magnetic field current sensor magnetically coupled to a conductor, a magnetic field signal having a magnitude responsive to a current flowing through the conductor; generating, by a shunt interface having first and second input terminals electrically coupled to ends of a shunt disposed along the conductor, a shunt signal having a magnitude responsive to the current flowing through the conductor; comparing, by a diagnostic circuit, the magnetic field signal and the shunt signal; and generating, by the diagnostic circuit, a fault signal based on the comparison.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
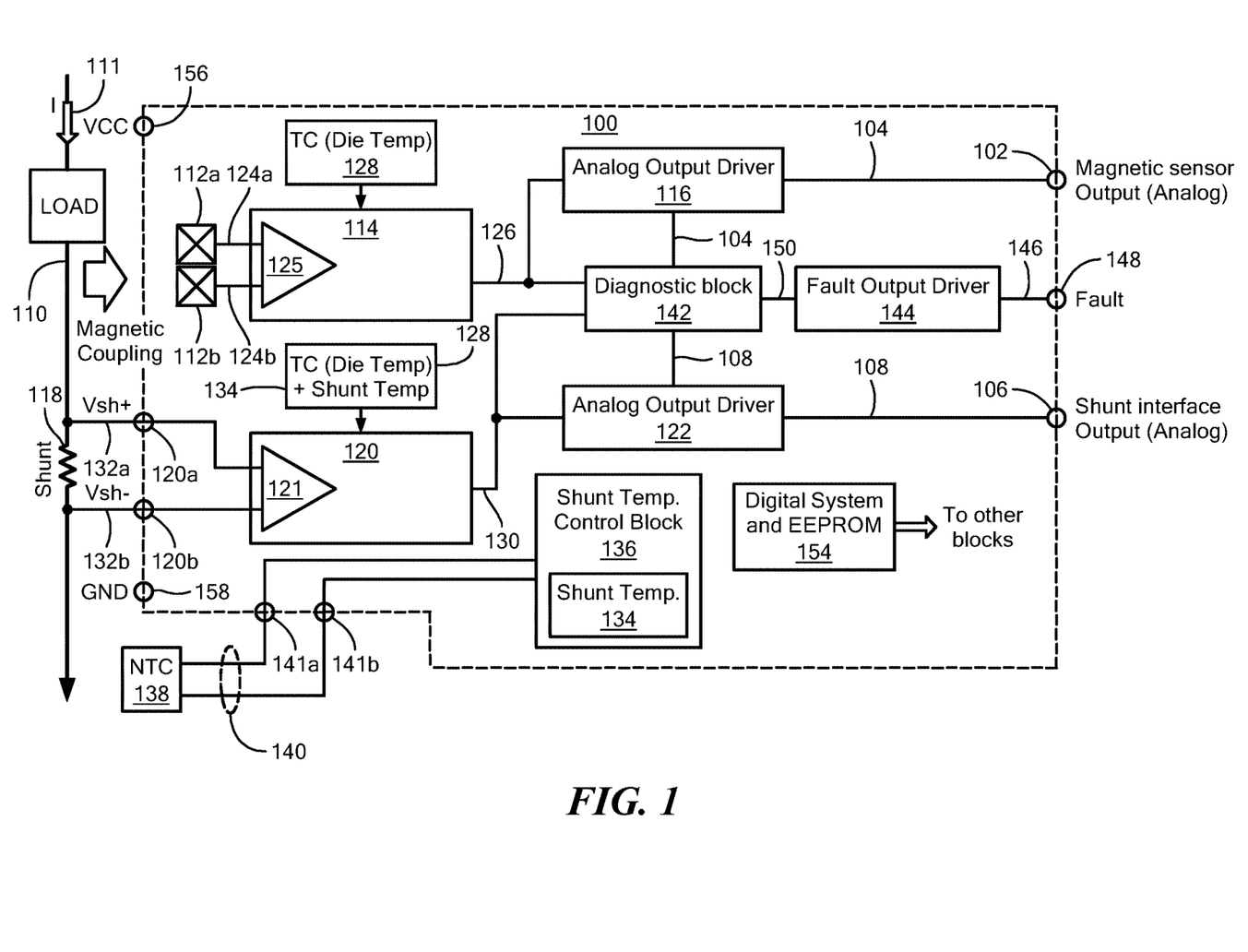
FIG. 1 is a block diagram of an integrated shunt and magnetic field current sensor having analog outputs, according to some embodiments.

FIG. 1 shows an integrated shunt and magnetic field current sensor 100 having a first analog output 102 to provide an analog magnetic field output signal 104 and a second analog output 106 to provide an analog shunt output signal 108. Both analog output signals 104, 108 are responsive to a current ("load current") 111 flowing through a conductor 110, which may be a busbar or other type of conductor. Analog magnetic field output signal 104 is generated by a magnetic field current sensor comprising one or more magnetic field sensing elements 112a, 112b (112 generally), a magnetic field signal path 114, and a first analog output driver 116. In some embodiments, the magnetic field current sensor may be a coreless current sensor, meaning that it does not require a magnetic core around the conductor 110 to sense current. In other embodiments, a current sensor with a core may be used. Analog shunt output signal 108 is generated by a shunt interface comprising a shunt signal path 120 electrically coupled to a shunt 118 and a second analog output driver 122.

The current sensor 100 further includes a diagnostic block 142 and a fault output driver 144 operable to detect one or more fault conditions (discussed in detail below) and, in response to detecting a fault condition, to provide a fault signal (or "flag") 146 at a third sensor output (or "fault pin") 148. The current sensor 100 including both the magnetic field current sensor and shunt interface can be provided within a single integrated circuit (IC) and, in some cases, on a single IC die. It will be appreciated that the two separate analog output signals 104, 108 provide heterogenous, redundant current sensing information that, in combination with fault signal 146, can be used to improve the safety and reliability of systems in which the current sensor 100 is deployed.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Magnetic field sensing elements 112 are arranged (e.g., oriented and/or positioned) such that each of the magnetic field sensing elements 112 can sense a magnetic field generated by the load current 111. As illustrated in FIG. 1, in some embodiments two magnetic field sensing elements 112a, 112b can be arranged to generate respective signals 124a, 124b having magnitudes (e.g., voltage levels) responsive to the load current 111. In some embodiments, magnetic field sensing elements 112a, 112b may be provided as planar Hall elements arranged to each sense different components of a magnetic field (i.e., arranged to sense a "differential field") produced by the load current 111. The differential field sensed by the two planar Hall elements is proportional to the load current 111 and, thus, the difference between the signals 124a, 124b generated by magnetic field sensing elements 112a, 112b can be used to determine the load current 111 as discussed further below in the context of FIG. 2A. While disclosed embodiments are shown and described as having planar Hall elements in a differential arrangement, other types and arrangements of magnetic field sensing elements can be used. Differential field sensing may be used in the disclosed embodiments to allow rejection of a stray magnetic field and/or a common mode field.

Magnetic field signal path 114 includes analog circuitry configured to generate a magnetic field signal 126 having a magnitude responsive to the load current 111. In some embodiments, magnetic field signal path 114 can include a differential amplifier 125 configured to receive signals 124a, 124b from magnetic field sensing elements 112a, 112b, respectively, and to generate magnetic field signal 126 based on a difference between the signals 124a, 124b and a known coupling factor between magnetic field sensing elements 112a, 112b. Magnetic field signal path 114 can also be configured to correct for offset in the magnetic field signal 126 due to, for example, mechanical stresses, magnetic interference, and/or temperature variations. For example, as shown in FIG. 1, magnetic field signal path 114 can receive a die temperature signal 128 having a magnitude responsive to a temperature of the die on which the magnetic field current sensor is disposed. Magnetic field signal path 114 can adjust the magnitude of the magnetic field signal 126 using the die temperature signal 128 to compensate for variations in die temperature to prevent the accuracy of the magnetic field current sensor from drifting over temperature. In some embodiments, magnetic field signal path 114 can perform offset correction using an amplifier, wherein the amplifier's gain is controlled using die temperature signal 128. In some embodiments, the die temperature can be converted to a temperature coefficient which, in turn, is applied to adjust the gain. Various temperature coefficients can be programmed into the sensor 100 prior to operation (e.g., at the factory). The amplifier used for magnetic field signal offset correction can be the same as the differential amplifier 125 configured to receive signals 124a, 124b, or it can be a separate amplifier (not shown). The type and class of amplifier(s) used can be selected based on the operating requirements of the current sensor 100, such as the range of load currents and/or voltages expected to be generated by magnetic field sensing elements 112 for a given application. Die temperature signal 128 can be generated using, for example, a silicon bandgap temperature sensor included with the sensor IC.

Shunt signal path 120 includes analog circuitry configured to generate a shunt signal 130 having a magnitude responsive to the load current 111. In more detail, the shunt interface includes first and second input terminals 120a, 120b which are electrically coupled to the ends of shunt 118 such that shunt signal path 120 is connected in parallel with shunt 118. The shunt 118 is disposed along, or in series with, conductor 110 such that all (or virtually all) of the load current 111 to be sensed flows through the shunt 118. In some embodiments, conductor 110 may be external to the current sensor 100. With this arrangement, shunt signal path 120 receives two signals 132a, 132b having a voltage difference that is proportional to the load current times the resistance of shunt 118, according to Ohm's law. Shunt signal path 120 can include one or more analog circuit elements configured to calculate the voltage difference and generate shunt signal 130 responsive to the load current 111. For example, as shown in FIG. 1, shunt signal path 120 can include an amplifier 121 (e.g., a differential amplifier or subtractor) configured to receive signals 132a, 132b and generate the shunt signal 130 therefrom. A gain of amplifier 121 can be set based on the known resistance of shunt 118.

Shunt signal path 120 can be configured to compensate for variations in the temperature that affect the resistance of shunt 118 (i.e., that cause the shunt resistance to drift over temperature). This improves the accuracy and stability of the shunt interface current sensing over different operating temperatures. For example, as shown in FIG. 1, shunt signal path 120 can receive the die temperature signal 128 responsive to the temperature of the die and a shunt temperature signal 134 having a magnitude responsive to a temperature of shunt 118. Shunt signal path 120 can apply temperature signals 128, 134 to adjust the magnitude of the shunt signal 130 (e.g., by adjusting the gain of amplifier 121 based on signal 134). In more detail, shunt signal path 120 can use die temperature signal 128 to compensate for variations in die temperature that would otherwise cause the accuracy of the shunt current sensor to drift over temperature (e.g., by converting die temperature to a temperature coefficient applied to adjust the gain of amplifier 121). Shunt temperature signal 134 can be used to compensate for shunt drift according to the particular shunt technology and type of shunt used. Similar to die temperature, the shunt temperature can be converted to a programmed temperature coefficient, which in turn can be applied to adjust the gain of amplifier 121. In some embodiments, shunt signal path 120 can adjust for shunt temperature but not die temperature. The type and class of amplifier 121 used within shunt interface 120 can be selected based on the operating requirements of current sensor 100 (e.g., based the range of load currents and/or voltages across terminals 120a, 120b expected for a given application).

As shown in FIG. 1, current sensor 100 can include a shunt temperature control block 136 configured to receive a signal 140 at from an external temperature sensor 138 via input terminals 141a, 142b. In some embodiments, external temperature sensor 138 may be provided as a negative temperature coefficient (NTC) thermistor or other type of thermistor. The external temperature sensor 138 may be positioned proximate to shunt 118 such that it is able to monitor the temperature of shunt 118 and generate signal 140 responsive thereto. For example, in the case of a thermistor, the external temperature sensor 138 may be positioned such that its resistance is generally proportional to the temperature of shunt 118. Shunt temperature control block 136 can include analog and/or digital circuitry configured to calculate, from signal 140, the shunt temperature signal 134 that is proportional to, or otherwise responsive to, the shunt temperature. In some embodiments, shunt temperature control block 136 can convert signal 140 to a programmed temperature coefficient, which in turn can be provided as input to shunt interface 120 (i.e., shunt temperature signal 134 may take the form of a temperature coefficient).

First analog output driver 116 includes analog circuitry configured to generate analog magnetic field output signal 104 as substantially identical to magnetic field signal 126 but electrically isolated from other portions of the magnetic field current sensor (e.g., from magnetic field sensing elements 112 and magnetic field signal path 114). Likewise, second analog output driver 122 includes analog circuitry configured to generate analog shunt output signal 108 as substantially identical to shunt signal 130 but isolated from option portions of the shunt interface (e.g., from shunt 118 and shunt signal path 120). In some embodiments, analog output drivers 116, 122 can include transistors to provide said electrical isolation.

Diagnostic block 142 includes analog and/or digital circuitry configured to compare the magnetic field signal 126 and the shunt signal 130 to validate the integrity and reliability of these signals. If the difference between signals 126, 130 exceeds a threshold value, diagnostic block 142 can generate an internal fault signal 150. In some analog implementations, diagnostic block 142 can include a differential amplifier or subtractor to calculate a difference between the two signals 126, 130 and an analog comparator (e.g., an op-amp comparator) to compare the difference to a preset reference voltage corresponding to the threshold value. In some digital implementations, diagnostic block 142 can include one or more analog-to-digital converters (ADCs) to convert the analog signals 126, 130 to digital signals, a digital subtractor to calculate the difference between the signals, and a digital comparator to compare the difference to the threshold value. In some embodiments, the threshold value can be stored within an electrically erasable programmable read-only memory (EEPROM) or other programmable non-volatile memory of the current sensor 100. The digital circuitry and EEPROM may form part of a digital system (or "domain") of the sensor 100, as indicated by block 154. Digital system block 154 may be omitted in embodiments where current sensor 100 is fully analog. In some embodiments, diagnostic block 142 can trigger a fault based on die temperature and/or shut temperature. In some embodiments, diagnostic block 142 may utilize one or more fault detection algorithms, such as a time-based fault detection algorithm whereby a fault is triggered after a threshold is exceeded for some minimum period of time. In some embodiments, diagnostic block 142 can use filtering to prevent (or reduce the likelihood) incorrect fault indications.

In some embodiments, diagnostic block 142 can include a fault counter attached to the output of the comparator. The fault counter can be configured to increment periodically (e.g., based on a defined clock) whenever the output of the comparator exceeds the threshold. When the counter exceeds another threshold value, diagnostic block 142 can generate internal fault signal 150 and reset the counter.

In addition to, or in lieu of, comparing signals 126, 130, diagnostic block 142 can compare the two analog output signals 104, 108 generated by respective analog output drivers 116, 122. This can be done to provide improved current sensing reliability by, for example, detecting faults that occur within the analog output drivers 116, 122. Diagnostic block 142 can use the same threshold value when comparing both pairs of signals 126, 130 and 104, 108, or it can use different threshold values for each comparison. Diagnostic block 142 can generate internal fault signal 150 if either pair of signals deviates by more than the threshold value(s).

In some embodiments, diagnostic block 142 can include one or more circuit elements to filter signals 126, 130 and/or signals 104, 108 prior to comparing them. This can be done, for example, to suppress normal, transient fluctuations in the magnetic field current sensor or shunt interface that may cause some deviation between the signals being compared. For example, in an analog implementation, diagnostic block 142 can include one or more low-pass filters to filter signals 126, 130 and/or signals 104, 108 prior to the comparison. As another example, diagnostic block 142 can filter the signals under comparison to account for differences in the accuracy of magnetic field current sensing versus the accuracy of shunt-based current sensing.

In some embodiments, diagnostic block 142 can detect an "over-current" fault condition by comparing an individual analog output signal 104 or 108 to a threshold value ("over-current threshold value") to detect if a current sensed by the magnetic field current sensor or shunt interface exceeds a maximum expected/rated current for a given application or sensor design. In some embodiments, diagnostic block 142 can also detect a "over-temperature" condition by comparing one or both temperature signals 128, 134 to a threshold value ("over-temperature threshold value") to detect if the die and/or shunt temperature exceeds a maximum expected/rated temperature for a given application or sensor design.

In some embodiments, the aforementioned threshold values can be predetermined, meaning that they are set, or fixed, in the factory at the time of manufacture, or by external means thereafter such as programming. In other embodiments, the threshold values may be adaptive, meaning that they are calculated or otherwise determined by the sensor 100 during operation. For example, diagnostic block 142 can calculate the threshold value based on the magnitude of the load current 111 such that the threshold value is proportional or otherwise responsive to the load current. This can be done to account for differences in the accuracy of the magnetic field current sensor and the shunt interface that cause signals 126, 130 and/or signals 104, 108 to deviate, under normal conditions, by an amount proportional to the load current 111. When adapting a threshold value based on the load current, diagnostic block 142 can assume that either one of signals 126, 130, or either one of signals 104, 108, is an accurate measure of the load current 111. In some embodiments, diagnostic block 142 can calculate/estimate the load current as an average of signals 126, 130 or signals 104, 108. In some embodiments, an adaptive threshold can be calculated based on magnitude of the signal having the highest magnitude of the two signals being compared. In some embodiments, an adaptive threshold can be calculated by selecting a scale factor from a lookup table based on the magnitude of one, or both, signals being compared. In an analog implementation, the lookup table can be replaced by a resistor divider network configured to convert the signal levels to a threshold. If the signal levels being compared are too small (e.g., below another threshold), the fault threshold may be clamped to a minimum threshold. Such adaptive threshold techniques can prevent incorrect fault detection when small current/signal is sensed. The aforementioned techniques can be implemented using analog and/or digital circuitry.

Diagnostic block 142 can generate internal fault signal 150 responsive to any of the fault detection techniques disclosed hereinabove, or a combination of such techniques.

Fault output driver 144 includes analog and/or digital circuitry to receive the internal fault signal 150 and generate a fault signal 146 provided at third sensor output 148. Fault output driver 144 may be configured to provide fault signal 146 as an open drain output or pin. Fault signal 146 can take various forms, such as a logic signal having a level depending on the difference between a pair of signals being compared (e.g., a high level if a fault exists, a low level otherwise). As an alternative, for example, fault signal 146 can take the form of a flag that is set when the difference between the pair of signals differs by the predetermined or adaptive threshold value. The fault signal 146 can be provided as output to various external devices or systems, such as an Engine Control Unit (ECU), to enable such external devices/systems to determine if analog output signal 104 and/or 108 is a reliable measure of the load current.

The illustrative current sensor 100 further includes a supply voltage input terminal 156 and a ground terminal 158 that can be connected to an external voltage source to power to the sensor's analog/digital circuitry.

While the illustrative current sensor 100 is shown as having two analog outputs 102, 106 to provide redundant current sensing information, in other embodiments an integrated shunt and magnetic field current sensor can have a single analog output 102 or 106 (along with fault pin 148). For example, first analog output driver 116 and first analog output 102 can be omitted such that the sensor provides, as output, analog shunt output signal 108 and fault signal 146. As another example, second analog output driver 122 and second analog output 106 can be omitted such that the sensor provides, as output, analog magnetic field output signal 104 and fault signal 146.

Figure 2A:
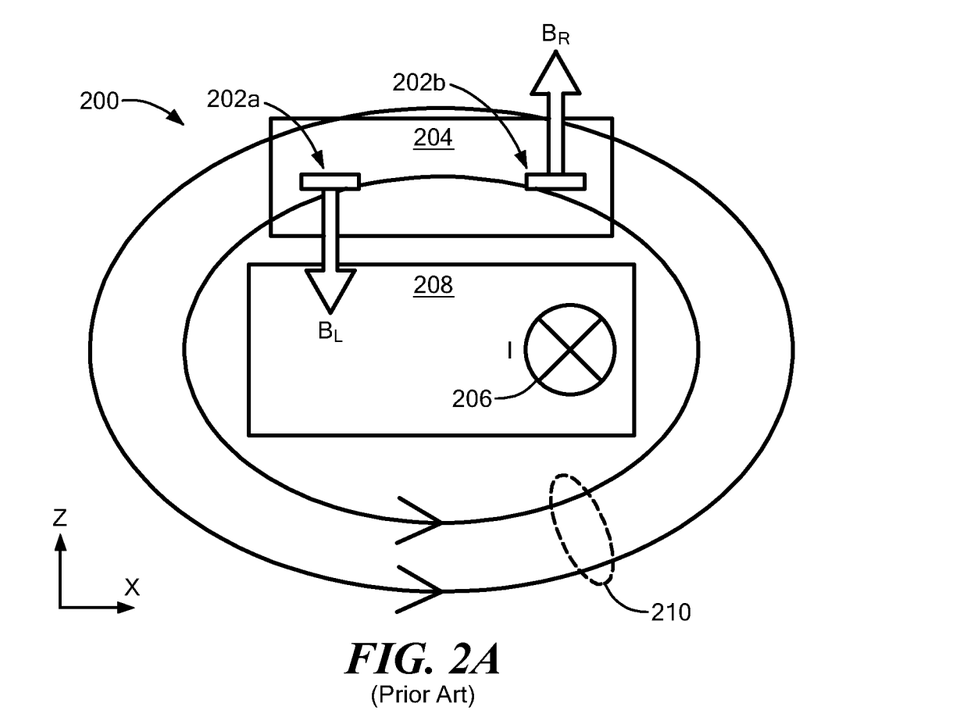
FIG. 2A shows a prior art arrangement of magnetic field sensing elements that can be used within disclosed embodiments of an integrated shunt and magnetic field current sensor.

FIG. 2A shows an arrangement 200 of magnetic field sensing elements that can be used within disclosed embodiments of an integrated shunt and magnetic field current sensor. Two magnetic field sensing elements 202a, 202b are disposed on a substrate 204 that extends along a Y axis in FIG. 2A, perpendicular to the page. The magnetic field sensing elements 202a, 202b, which may be provided as planar Hall elements, are arranged to have axes of maximum sensitivity perpendicular to the substrate 204, along the Z axis in FIG. 2A. A current 206 flowing through a conductor (e.g., a busbar) 208 produces a magnetic field 210 having components within the X-Z plane. The magnetic field sensing elements 202a, 202b are spaced apart and positioned on the substrate 204 such that they sense different components of the magnetic field 210. As shown, a first magnetic field sensing element 202a can sense a first magnetic field component, $B_L$, directed along the −Z axis, and a second magnetic field sensing element 202b can sense a second magnetic field component, $B_R$, directed along the +Z axis. The differential field sensed by the magnetic field sensing elements 202a, 202b, along with a known coupling factor between the magnetic field sensing elements 202a, 202b, can be used to calculate the current 206 as previously discussed.

Figure 2B:
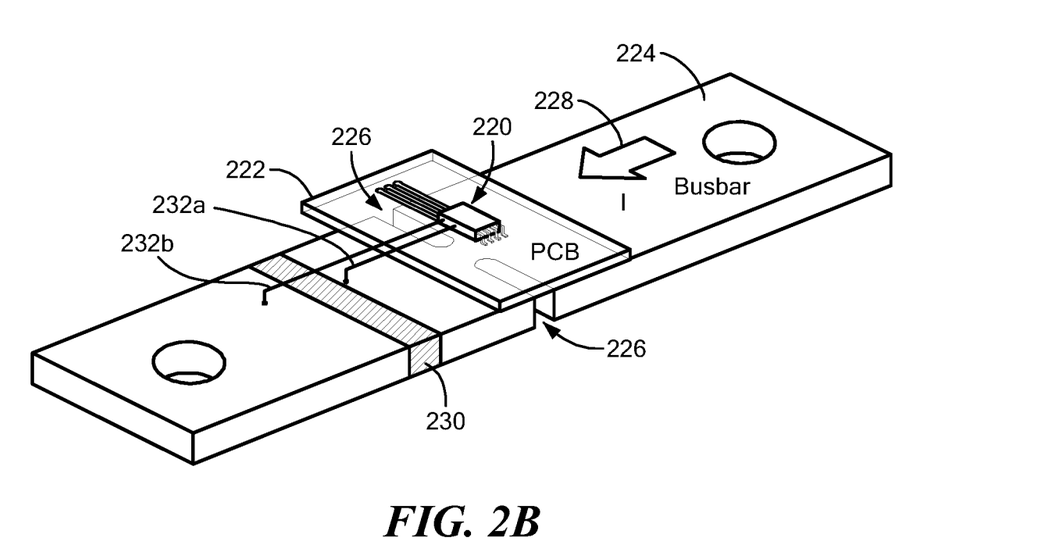
FIG. 2B is perspective view of an integrated shunt and magnetic field current sensor device disposed over a busbar, according to some embodiments.

Turning to FIG. 2B, disclosed embodiments of an integrated shunt and magnetic field current sensor can be packaged as an integrated circuit (IC) 220 that is attached to a printed circuit board (PCB) 222 and disposed over a busbar 224. Notches 226 can be cut from, or otherwise formed on, both sides of busbar 224. Current sensor IC 220 can be positioned over the busbar and between the notches 226 as shown. In this arrangement, a current 228 flowing through the busbar 224 will produce a magnetic field around the sensor IC 220 where it can be sensed by magnetic field sensing elements included therein (e.g., magnetic field sensing elements 112a, 112b of FIG. 1). A shunt 230 can be disposed along the busbar 224 to produce a voltage drop along the busbar proportional to the current 228 times the resistance of shunt 230. A pair of conductive paths (e.g., wires) 232a, 232b can be electrically coupled, at first ends, to the busbar 224 on either side of the shunt 230 and, at second ends, to the sensor IC 220. In more detail, conductive paths 232a, 232b can be connected to respective first and second input terminals of a shunt interface included within the sensor IC 220 (e.g., input terminals 120a, 120b of FIG. 1). The sensor IC 220 can include disclosed embodiments of analog and/or digital circuitry to sense the current 228 using both magnetic field current sensing and the shunt-based current sensing, and to indicate a fault if the redundant current sensing information deviates by more than a threshold amount. In the simplified example of FIG. 2B, the shunt is integrated on the same conductor as the magnetic sensor. In other embodiments, the shunt can be located on a separate conductor (e.g., a conductor made of different material).

Figure 3:
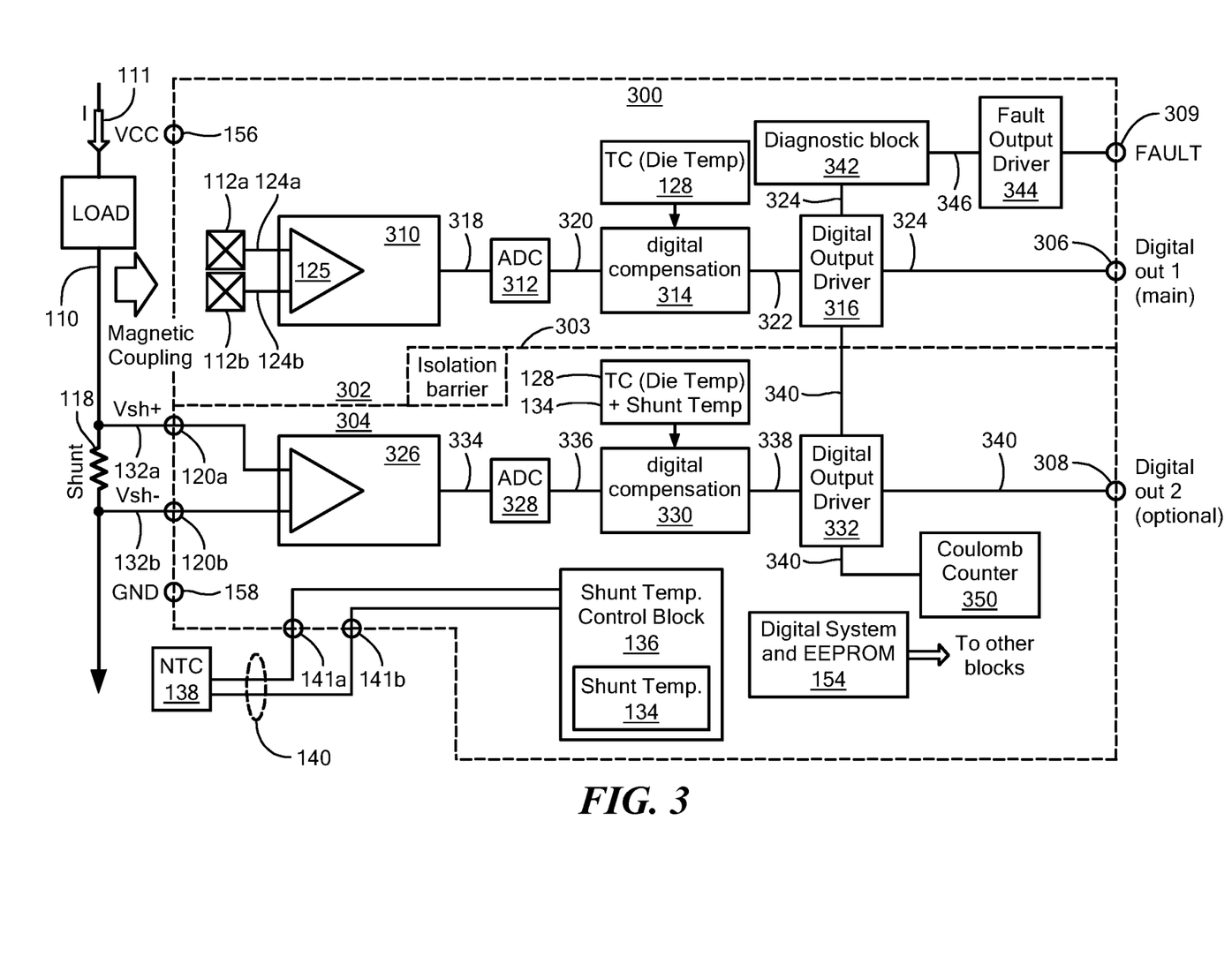
FIG. 3 is a block diagram of an integrated shunt and magnetic field current sensor having digital outputs, according to some embodiments.

FIG. 3, in which like elements of FIG. 1 are identified using like reference numerals, shows an example of an integrated shunt and magnetic field current sensor having digital outputs. An illustrative current sensor 300 includes a magnetic field current sensor 302 and a shunt interface 304 having respective digital outputs 306 and 308. The current sensor 300 further includes a third sensor output (or "fault pin") 309 which is shown as part of a magnetic field current sensor 302.

Current sensor 300 functions similar to current sensor 100 of FIG. 1 by generating two signals both responsive to the load current and a fault signal indicating whether the redundant current signals deviate by more than a threshold amount. However, in contrast to current sensor 100 of FIG. 1, the illustrative current sensor 300 of FIG. 3 converts the magnetic field signal and shunt signal to digital signals and operates on the signals in the digital domain. The analog portions of the magnetic field current sensor 302 and shunt interface 304 may be electrically isolated from each other to provide improved signal availability and safety, e.g., by protecting against electrostatic discharge (ESD) events or other electrical events on conductor 100. In some embodiments, current sensor 300 may be provided within an IC and magnetic field current sensor 302 and shunt interface 304 may be separated by an isolation barrier 303 formed within the IC.

Magnetic field current sensor 302 includes magnetic field sensing elements 112a, 112b, analog magnetic field circuitry 310, a first ADC 312, a first digital compensation block 314, and a first digital output driver 316. Analog magnetic field circuitry 310 includes one or more analog circuit elements configured to generate an analog magnetic field signal 318 having a magnitude responsive to the load current 111. Said circuitry may be like that described above for magnetic field signal path 114 of FIG. 1, except that, in the embodiment of FIG. 3, die temperature compensation is performed by the separate digital compensation block 314. First ADC 312 is configured to convert the analog magnetic field signal 318 to a digital magnetic field signal 320 that encodes or otherwise represents a digital value responsive to the load current 111. First digital compensation block 314 is configured to adjust the value of digital magnetic field signal 320 using die temperature signal 128 to compensate for temperature variations of the die on which the magnetic field current sensor 302 is disposed. The adjusted digital magnetic field signal 322 is provided to first digital output driver 316 which in turn generates a digital magnetic field output signal 324 provided at first digital output 306.

Shunt interface 304 includes analog shunt interface circuitry 326, a second ADC 328, a second digital compensation block 330, and a second digital output driver 332. Analog shunt interface circuitry 310 includes one or more analog circuit elements configured to generate an analog shunt signal 334 having a magnitude responsive to the load current 111. Said circuitry may be like that described above for shunt signal path 120 of FIG. 1, except that, in the embodiment of FIG. 3, temperature compensation is performed by the separate digital compensation block 330. Second ADC 328 is configured to convert the analog shunt signal 334 to a digital shunt signal 336 that encodes or otherwise represents a digital value responsive to the load current 111. Second digital compensation block 330 is configured to adjust the value of digital shunt signal 336 using temperature signals 128, 134 to compensate for variations in die temperature and shunt temperature. The adjusted digital shunt signal 338 is provided to second digital output driver 332 which in turn generates a digital shunt output signal 340 provided at second digital output 308.

The current sensor 300 further includes a diagnostic block 342 and a fault output driver 344. Diagnostic block 342 receives digital output signals 324, 340 from digital output drivers 316, 332, respectively. Diagnostic block 342 is configured to compare digital output signals 324, 340 to validate the integrity and reliability of sensor output using, for example, any of the fault detection techniques described above in the context diagnostic block 142 of FIG. 1. For example, diagnostic block 342 can calculate a difference between the digital signal 324, 340 values and compare the difference to a predetermined or adaptive threshold to determine if a fault condition exists. Such techniques can be implemented within diagnostic block 342 using digital logic gates and other digital components. Diagnostic block 342 can generate internal fault signal 346 responsive to any of the fault detection techniques disclosed herein, or a combination of said techniques. Fault output driver 344 is configured to receive the internal fault signal 346 and generate a fault signal (or "flag") 358 provided at third sensor output 309. The generated fault signal 458 may take various forms, such as those described above in the context of fault signal 146 of FIG. 1.

FIG. 3 shows diagnostic block 342, fault output driver 344, and third sensor output 309 as being part of magnetic field current sensor 302. In this arrangement, fault pin 309 may be electrically protected from conductor 110 due to isolation barrier 303 and the fact that magnetic field sensing elements 112a, 112b are contactless with respect to conductor 110. In other embodiments, diagnostic block 342, fault output driver 344, and third sensor output 309 may be provided within shunt interface 304.

The digital blocks 314, 316, 330, 332, 342, 344 may correspond to portions of a digital system/domain implemented using, for example, digital circuitry and EEPROM within the sensor 300, as indicated by block 154. Magnetic field current sensor 302 and/or shunt interface 304 can include additional digital blocks to provide additional current-sensing functionality. For example, as shown in FIG. 3, shunt interface 304 can include a Coulomb counter block 350 configured to measure the load current over time based on digital shunt output signal 340. In some embodiments, first digital output 306 or second digital output 308 can be omitted. In some embodiments, outputs 306, 309, 308 can be combined into a single digital output signal.

Figure 4:
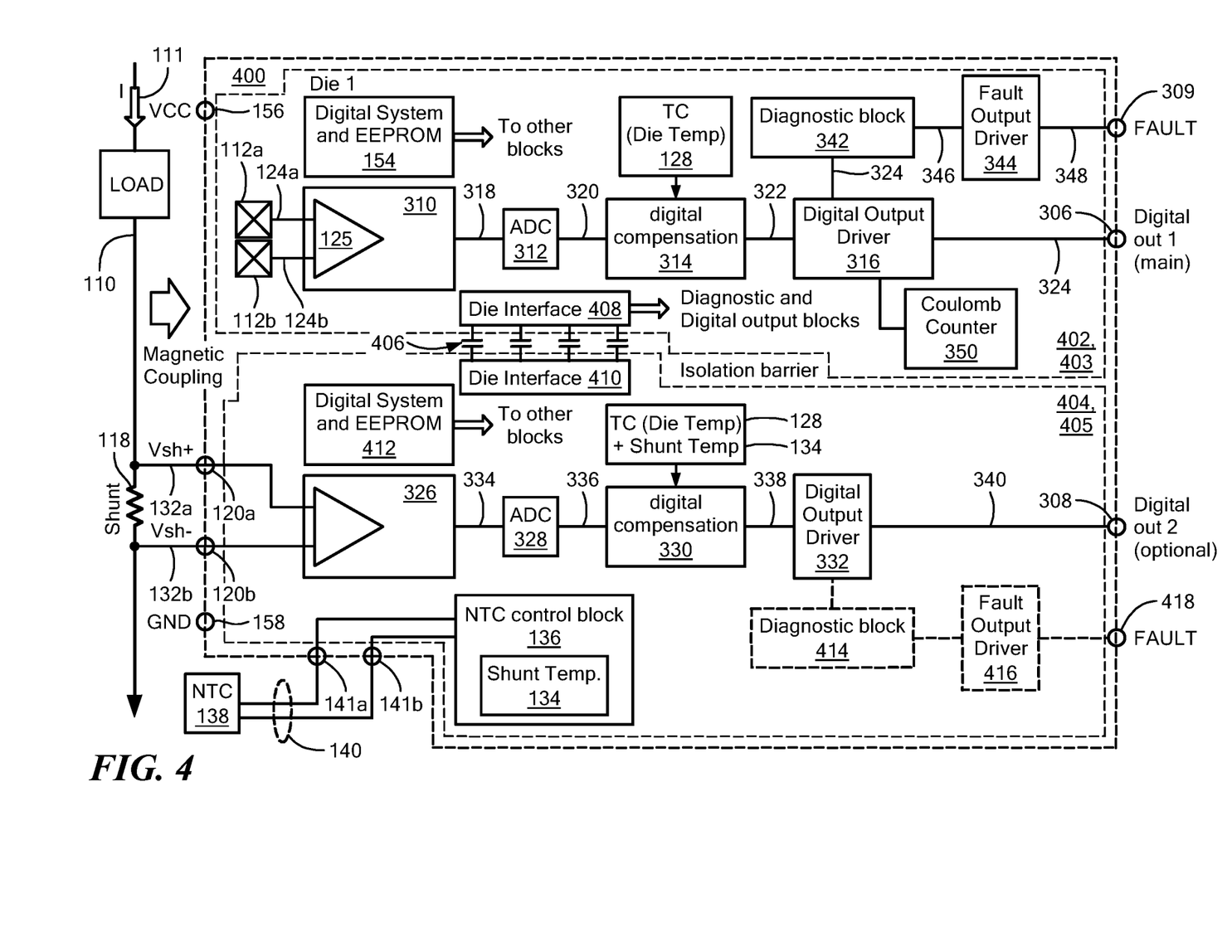
FIG. 4 is a block diagram of a current sensor having a shunt interface and a magnetic field current sensor isolated on separate dies, according to some embodiments.

FIG. 4, in which like elements of FIGS. 1 and 3 are identified using like reference numerals, shows another example integrated shunt and magnetic field current sensor having digital outputs. An illustrative current sensor 400 includes a magnetic field current sensor 402 and a shunt interface 404 having respective digital outputs 306 and 308, and third sensor output (or "fault pin") 309. Magnetic field current sensor 402 and shunt interface 404 are provided on two separate dies 403, 405 separated by an isolation barrier 406. In some embodiments, the two separate dies may be provided within a single IC package. Each die 403, 405 can include separate digital system circuitry, as indicated by boxes 154, 412 respectively. Arranging magnetic field current sensor 402 and shunt interface 404 on separate dies can provide better isolation between these redundant current sensing means. For example, if either magnetic field current sensor 402 or shunt interface 404 is destroyed by an electrical event (e.g., an ESD event), current sensor 400 may continue to operate using the surviving current sensing means.

The two dies 403, 405 can communicate with each other via a digital interface comprising a first die interface 408 provided on the magnetic field current sensor die 403, and a second die interface 410 provided on the shunt interface die 405. In more detail, digital shunt output signal 340 can be transmitted, via digital interface 408, 410, from second digital output driver 332 on the shunt interface die 405 to diagnostic block 342 on the magnetic field current sensor die 403. The digital interface 408, 410 can include, for example, a serial peripheral interface (SPI) interface, an inter-integrated circuit (I²C) interface, or an optical interface. Current sensor 400 functions similar to current sensor 300 of FIG. 3 by comparing, in the digital domain, the current sensed by the magnetic field current sensor to the current sensed by the shunt interface to provide improved integrity and reliability.

FIG. 4 shows diagnostic block 342, fault output driver 344, and third sensor output 309 as being located on magnetic field current sensor die 403. In this arrangement, fault pin 309 may be electrically protected from conductor 110 due to isolation barrier 406 and the fact that magnetic field sensing elements 112a, 112b are contactless with the respect to conductor 110. For additional reliability and safety, in some embodiments, a separate diagnostic block and fault output driver may be provided on the shunt interface die 405 to provide a redundant diagnostics and fault detection, as shown by optional blocks 414, 416 in FIG. 4. Here, digital interface 408, 410 can be provided as a bi-directional interface to allow digital magnetic field output signal 340 to be transmitted to diagnostic block 414 on shunt interface die 405 and digital shunt output signal 340 to be transmitted to diagnostic block 342 on magnetic field current sensor die 403. The output of redundant fault output driver 416 can be provided at an optional fourth sensor output 418, as shown.

Figure 5:
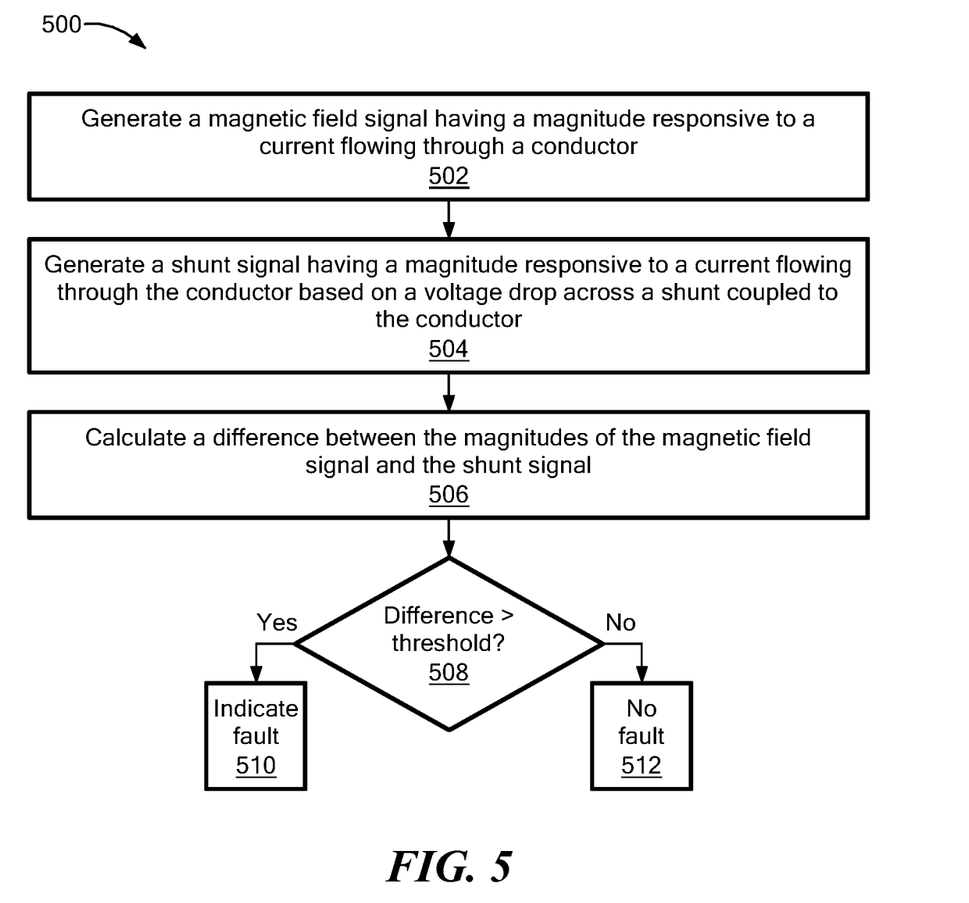
FIG. 5 is flow diagram showing a fault detection process that can be implemented within an integrated shunt and magnetic field current sensor, according to some embodiments.

FIG. 5 shows a process for detecting a fault in an integrated shunt and magnetic field current sensor, according to some embodiments. Illustrative process 500 can be implemented, for example, within any of current sensors 100, 300, and 400 of FIGS. 1, 3, and 4, respectively.

At block 502, a magnetic field signal is generated having a magnitude responsive to a current flowing through a conductor ("load current"), such as a busbar or other external conductor. In some embodiments, the magnetic field signal is generated using a differential Hall-effect sensor. In some embodiments, the magnetic field signal can be adjusted to correct for offset due to, for example, temperature variation of the die on which the current sensor is disposed.

At block 504, a shunt signal having is generated having a magnitude responsive to the load current based on a voltage drop across a shunt coupled to the conductor. In some embodiments, the shunt signal can be adjusted to compensate for variations in the temperature that affect the resistance of shunt. For example, the current sensor can receive a shunt temperature signal responsive to a temperature of the shunt and to adjust the magnitude of the shunt signal using the shunt temperature signal. In some embodiments, the shunt temperature signal can be generated using an external temperature sensor (e.g., a NTC thermistor) located near the shunt. In some embodiments, the shunt signal can also be adjusted for variations in die temperature.

At block 506, a difference between the magnitudes of the magnetic field signal and the shunt signal can be calculated, e.g., using a differential amplifier or digital subtractor. In some embodiments, prior to calculating the difference, the magnetic field signal and shunt signal can be converted from analog to digital signals. In some embodiments, the current sensor can include output drivers to convert the magnetic field signal and shunt signal into respective output signals. Here, block 506 can include calculating a difference between the two output signals in addition to, or in lieu of, calculating the difference between the magnetic field signal and shunt signal. In some embodiments, the current sensor can include an isolation barrier between a magnetic field current sensor used to generate the magnetic field signal and a shunt interface used to generate the shunt signal. In such embodiments, prior to calculating the difference in signal magnitudes, the shunt signal can be transmitted to the magnetic field current sensor across the isolation barrier via a digital interface. Alternatively, or additionally, the magnetic field signal can be transmitted to the shunt interface via the digital interface.

At block 508, the calculated difference in signal magnitudes can be compared to a threshold value. In some embodiments, the threshold value can be a predetermined value that is programmed or hardcoded within the current sensor. In other embodiments, the threshold value can be an adaptive threshold value calculated, for example, based on the magnitude of the load current.

If the difference in signal magnitudes is greater than the threshold value, then a fault condition can be indicated (block 510). For example, the current sensor can generate a fault signal at a fault pin or other sensor output. If the difference in signal magnitudes is less than or equal to the threshold value, then no fault condition is indicated (block 512).

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A device comprising:
a magnetic field current sensor magnetically coupled to a conductor and configured to generate a magnetic field signal having a magnitude responsive to a current flowing through the conductor;
a shunt interface having first and second input terminals electrically coupled to ends of a shunt disposed along the conductor, the shunt interface configured to generate a shunt signal having a magnitude responsive to the current flowing through the conductor;
a first analog output driver configured to generate an analog magnetic field output signal responsive to the magnetic field signal;
a second analog output driver configured to generate an analog shunt output signal responsive to the shunt signal; and
a diagnostic circuit configured to receive the analog magnetic field signal and the shunt signal and to generate a fault signal based on a comparison between a magnitude of the magnetic field signal and a magnitude of the shunt signal.

2. The device of claim 1, wherein the diagnostic circuit is configured to:
calculate a difference between the magnitude of the magnetic field signal and the magnitude of the shunt signal; and
compare the difference to a predetermined threshold value to generate the fault signal.

3. The device of claim 1, wherein the diagnostic circuit is configured to generate the fault signal further based on a comparison of the analog magnetic field output signal and the analog shunt output signal.

4. The device of claim 1, wherein the magnetic field current sensor is disposed on a die, wherein the magnetic field current sensor is configured to receive a die temperature signal responsive to a temperature of the die and to adjust the magnitude of the magnetic field signal using the die temperature signal.

5. The device of claim 1, wherein the shunt interface is configured to receive a shunt temperature signal responsive to a temperature of the shunt and to adjust the magnitude of the shunt signal using the shunt temperature signal.

6. The device of claim 5, wherein the shunt interface comprises:
a differential amplifier having first and second input terminals coupled to the first and second input terminals of the shunt interface; and
an output terminal to provide the shunt signal,
wherein the shunt interface is configured to adjust a gain of the differential amplifier using the shunt temperature signal.

7. The device of claim 5, where the signal responsive to the temperature of the shunt is received from an external temperature sensor configured to measure the temperature of the shunt.

8. The device of claim 7, where the external temperature sensor comprises a negative temperature coefficient (NTC) thermistor.

9. The device of claim 5, wherein the shunt interface is disposed on a die, wherein the shunt interface is configured to receive a die temperature signal responsive to a temperature of the die and to adjust the magnitude of the shunt signal further using the die temperature signal.

10. The device of claim 1, wherein the magnetic field current sensor comprises a differential Hall-effect sensor.

11. The device of claim 1, wherein the magnetic field current sensor, the shunt interface, and the diagnostic circuit are included within an integrated circuit (IC).

12. The device of claim 11, wherein the magnetic field current sensor is included on a first die of the IC and the shunt interface is included on a second die of the IC.

13. The device of claim 12, wherein the diagnostic circuit is included on the first die, the device further comprising:
    another diagnostic circuit, included on the second die, configured to receive the magnetic field signal and the shunt signal and to generate another fault signal based on another comparison between the magnitude of the magnetic field signal and the magnitude of the shunt signal.

14. A device comprising:
    a magnetic field current sensor magnetically coupled to a conductor and configured to generate a magnetic field signal having a magnitude responsive to a current flowing through the conductor;
    a shunt interface having first and second input terminals electrically coupled to ends of a shunt disposed along the conductor, the shunt interface configured to generate a shunt signal having a magnitude responsive to the current flowing through the conductor;
    a first analog-to-digital converter (ADC) coupled to an output terminal of the magnetic field current sensor to convert the magnetic field signal from an analog signal to a digital signal;
    a second ADC coupled to an output terminal of the shunt interface to convert the shunt signal from an analog signal to a digital signal; and
    a diagnostic circuit configured to receive the digital magnetic field signal and the digital shut signal and to generate a fault signal based on a comparison between a magnitude of the digital magnetic field signal and a magnitude of the digital shunt signal.

15. The device of claim 14, further comprising:
    a first digital output driver configured to generate a digital magnetic field output signal responsive to the digital magnetic field signal; and
    a digital second output driver configured to generate a digital shunt output signal responsive to the digital shunt signal,
    wherein the diagnostic circuit generates the fault signal based on a comparison between the digital magnetic field output signal and the digital shunt output signal.

16. The device of claim 15, further comprising an isolation barrier between the first output driver and the second output driver.

17. The device of claim 16, wherein the isolation barrier includes at least one of:
    a serial peripheral interface (SPI);
    an inter-integrated circuit (I²C) interface; or
    an optical interface.

18. The device of claim 14, wherein the diagnostic circuit is configured to:
    calculate a difference between the magnitude of the digital magnetic field signal and the magnitude of the digital shunt signal; and
    compare the difference to a predetermined threshold value to generate the fault signal.

19. The device of claim 14, wherein the magnetic field current sensor is disposed on a die, wherein the magnetic field current sensor is configured to receive a die temperature signal responsive to a temperature of the die and to adjust the magnitude of the magnetic field signal using the die temperature signal.

20. The device of claim 14, wherein the shunt interface is configured to receive a shunt temperature signal responsive to a temperature of the shunt and to adjust the magnitude of the shunt signal using the shunt temperature signal.

21. The device of claim 20, wherein the shunt interface comprises:
    a differential amplifier having first and second input terminals coupled to the first and second input terminals of the shunt interface; and
    an output terminal to provide the shunt signal,
    wherein the shunt interface is configured to adjust a gain of the differential amplifier using the shunt temperature signal.

22. The device of claim 20, where the signal responsive to the temperature of the shunt is received from an external temperature sensor configured to measure the temperature of the shunt.

23. The device of claim 22, where the external temperature sensor comprises a negative temperature coefficient (NTC) thermistor.

24. The device of claim 20, wherein the shunt interface is disposed on a die, wherein the shunt interface is configured to receive a die temperature signal responsive to a temperature of the die and to adjust the magnitude of the shunt signal further using the die temperature signal.

25. The device of claim 14, wherein the magnetic field current sensor comprises a differential Hall-effect sensor.

26. The device of claim 14, wherein the magnetic field current sensor, the shunt interface, and the diagnostic circuit are included within an integrated circuit (IC).

27. The device of claim 26, wherein the magnetic field current sensor is included on a first die of the IC and the shunt interface is included on a second die of the IC.

28. The device of claim 27, wherein the diagnostic circuit is included on the first die, the device further comprising:
    another diagnostic circuit, included on the second die, configured to receive the magnetic field signal and the shunt signal and to generate another fault signal based on another comparison between the magnitude of the magnetic field signal and the magnitude of the shunt signal.

29. A device comprising:
    a magnetic field current sensor magnetically coupled to a conductor and configured to generate a magnetic field signal having a magnitude responsive to a current flowing through the conductor;
    a shunt interface having first and second input terminals electrically coupled to ends of a shunt disposed along the conductor, the shunt interface configured to generate a shunt signal having a magnitude responsive to the current flowing through the conductor, wherein the shunt interface is configured to receive a shunt temperature signal responsive to a temperature of the shunt and to adjust the magnitude of the shunt signal using the shunt temperature signal; and
    a diagnostic circuit configured to receive the magnetic field signal and the shunt signal and to generate a fault signal based on a comparison between a magnitude of the magnetic field signal and a magnitude of the shunt signal.

30. The device of claim 29, wherein the shunt interface comprises:
    a differential amplifier having first and second input terminals coupled to the first and second input terminals of the shunt interface; and
    an output terminal to provide the shunt signal,
    wherein the shunt interface is configured to adjust a gain of the differential amplifier using the shunt temperature signal.

31. The device of claim 29, where the signal responsive to the temperature of the shunt is received from an external temperature sensor configured to measure the temperature of the shunt.

32. The device of claim 31, where the external temperature sensor comprises a negative temperature coefficient (NTC) thermistor.

33. The device of claim 29, wherein the shunt interface is disposed on a die, wherein the shunt interface is configured to receive a die temperature signal responsive to a temperature of the die and to adjust the magnitude of the shunt signal further using the die temperature signal.

34. The device of claim 29, wherein the diagnostic circuit is configured to:
calculate a difference between the magnitude of the magnetic field signal and the magnitude of the shunt signal; and
compare the difference to a predetermined threshold value to generate the fault signal.

35. The device of claim 29, further comprising:
a first analog output driver configured to generate an analog magnetic field output signal responsive to the magnetic field signal; and
a second analog output driver configured to generate an analog shunt output signal responsive to the shunt signal,
wherein the diagnostic circuit is configured to generate the fault signal further based on a comparison of the analog magnetic field output signal and the analog shunt output signal.

36. The device of claim 29, wherein the magnetic field current sensor is disposed on a die, wherein the magnetic field current sensor is configured to receive a die temperature signal responsive to a temperature of the die and to adjust the magnitude of the magnetic field signal using the die temperature signal.

37. The device of claim 29, wherein the magnetic field current sensor comprises a differential Hall-effect sensor.

38. The device of claim 29, further comprising:
a first analog-to-digital converter (ADC) coupled to an output terminal of the magnetic field current sensor to convert the magnetic field signal from an analog signal to a digital signal; and
a second ADC coupled to an output terminal of the shunt interface to convert the shunt signal from an analog signal to a digital signal,
wherein the diagnostic circuit generates the fault signal based on a comparison between the digital magnetic field signal and the digital shunt signal.

39. The device of claim 38, further comprising:
a first digital output driver configured to generate a digital magnetic field output signal responsive to the digital magnetic field signal; and
a digital second output driver configured to generate a digital shunt output signal responsive to the digital shunt signal,
wherein the diagnostic circuit generates the fault signal based on a comparison between the digital magnetic field output signal and the digital shunt output signal.

40. The device of claim 39, further comprising an isolation barrier between the first output driver and the second output driver.

41. The device of claim 40, wherein the isolation barrier includes at least one of:
a serial peripheral interface (SPI);
an inter-integrated circuit (I²C) interface; or
an optical interface.

42. The device of claim 29, wherein the magnetic field current sensor, the shunt interface, and the diagnostic circuit are included within an integrated circuit (IC).

43. The device of claim 42, wherein the magnetic field current sensor is included on a first die of the IC and the shunt interface is included on a second die of the IC.

44. The device of claim 43, wherein the diagnostic circuit is included on the first die, the device further comprising:
another diagnostic circuit, included on the second die, configured to receive the magnetic field signal and the shunt signal and to generate another fault signal based on another comparison between the magnitude of the magnetic field signal and the magnitude of the shunt signal.

45. A device comprising:
a magnetic field current sensor magnetically coupled to a conductor and configured to generate a magnetic field signal having a magnitude responsive to a current flowing through the conductor;
a shunt interface having first and second input terminals electrically coupled to ends of a shunt disposed along the conductor, the shunt interface configured to generate a shunt signal having a magnitude responsive to the current flowing through the conductor wherein the magnetic field current sensor, the shunt interface, and the diagnostic circuit are included within an integrated circuit (IC), wherein the magnetic field current sensor is included on a first die of the IC and the shunt interface is included on a second die of the IC; and
a diagnostic circuit configured to receive the magnetic field signal and the shunt signal and to generate a fault signal based on a comparison between a magnitude of the magnetic field signal and a magnitude of the shunt signal.

46. The device of claim 45, wherein the diagnostic circuit is included on the first die, the device further comprising:
another diagnostic circuit, included on the second die, configured to receive the magnetic field signal and the shunt signal and to generate another fault signal based on another comparison between the magnitude of the magnetic field signal and the magnitude of the shunt signal.

47. The device of claim 45, wherein the diagnostic circuit is configured to:
calculate a difference between the magnitude of the magnetic field signal and the magnitude of the shunt signal; and
compare the difference to a predetermined threshold value to generate the fault signal.

48. The device of claim 45, wherein the magnetic field current sensor is disposed on a die, wherein the magnetic field current sensor is configured to receive a die temperature signal responsive to a temperature of the die and to adjust the magnitude of the magnetic field signal using the die temperature signal.

49. The device of claim 45, wherein the shunt interface is configured to receive a shunt temperature signal responsive to a temperature of the shunt and to adjust the magnitude of the shunt signal using the shunt temperature signal.

50. The device of claim 49, wherein the shunt interface comprises:
a differential amplifier having first and second input terminals coupled to the first and second input terminals of the shunt interface; and
an output terminal to provide the shunt signal, wherein the shunt interface is configured to adjust a gain of the differential amplifier using the shunt temperature signal.

51. The device of claim 49, where the signal responsive to the temperature of the shunt is received from an external temperature sensor configured to measure the temperature of the shunt.

52. The device of claim 51, where the external temperature sensor comprises a negative temperature coefficient (NTC) thermistor.

53. The device of claim 49, wherein the shunt interface is disposed on a die, wherein the shunt interface is configured to receive a die temperature signal responsive to a temperature of the die and to adjust the magnitude of the shunt signal further using the die temperature signal.

54. The device of claim 45, wherein the magnetic field current sensor comprises a differential Hall-effect sensor.

55. The device of claim 45, further comprising:
a first analog-to-digital converter (ADC) coupled to an output terminal of the magnetic field current sensor to convert the magnetic field signal from an analog signal to a digital signal; and
a second ADC coupled to an output terminal of the shunt interface to convert the shunt signal from an analog signal to a digital signal,
wherein the diagnostic circuit generates the fault signal based on a comparison between the digital magnetic field signal and the digital shunt signal.

56. The device of claim 55, further comprising:
a first digital output driver configured to generate a digital magnetic field output signal responsive to the digital magnetic field signal; and
a digital second output driver configured to generate a digital shunt output signal responsive to the digital shunt signal,
wherein the diagnostic circuit generates the fault signal based on a comparison between the digital magnetic field output signal and the digital shunt output signal.

57. The device of claim 56, further comprising an isolation barrier between the first output driver and the second output driver.

58. The device of claim 57, wherein the isolation barrier includes at least one of:
a serial peripheral interface (SPI);
an inter-integrated circuit ($I^2C$) interface; or
an optical interface.

* * * * *

UNITED STATES PATENT AND TRADEMARK OFFICE
CERTIFICATE OF CORRECTION

PATENT NO. : 11,555,832 B2
APPLICATION NO. : 17/189480
DATED : January 17, 2023
INVENTOR(S) : Andreas P. Friedrich et al.

It is certified that error appears in the above-identified patent and that said Letters Patent is hereby corrected as shown below:

In the Specification

Column 6, Line 28 delete "141a, 142b." and replace with --141a, 141b.--.

Column 7, Line 19 delete "shut" and replace with --shunt--.

Column 10, Line 16 delete "conductor 100" and replace with --conductor 110--.

Column 10, Line 46 delete "Analog shunt interface circuitry 310" and replace with --Analog shunt interface circuitry 326--.

Column 11, Line 14 delete "358" and replace with --348--.

Column 11, Line 15 delete "458" and replace with --348--.

In the Claims

Column 15, Line 31 delete "shut" and replace with --shunt--.

Signed and Sealed this
Twenty-eighth Day of November, 2023

Katherine Kelly Vidal
*Director of the United States Patent and Trademark Office*